US012699149B2

(12) United States Patent
Wang et al.

(10) Patent No.: US 12,699,149 B2
(45) Date of Patent: Aug. 4, 2026

(54) DISPLAY PANEL CABLE FAULT DETECTION

(71) Applicant: DELL PRODUCTS L.P., Round Rock, TX (US)

(72) Inventors: Isaac Q. Wang, Austin, TX (US); James L. Petivan, III, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 423 days.

(21) Appl. No.: 18/478,017

(22) Filed: Sep. 29, 2023

(65) Prior Publication Data

US 2025/0110187 A1    Apr. 3, 2025

(51) Int. Cl.
| | |
|---|---|
| *G06F 1/16* | (2006.01) |
| *G01R 31/52* | (2020.01) |
| *G06F 1/18* | (2006.01) |
| *H01B 9/02* | (2006.01) |
| *H01B 9/04* | (2006.01) |
| *H05K 5/00* | (2025.01) |
| *H05K 7/00* | (2006.01) |

(52) U.S. Cl.
CPC .............. *G01R 31/52* (2020.01); *G06F 1/189* (2013.01); *H01B 9/02* (2013.01); *H01B 9/04* (2013.01)

(58) Field of Classification Search
CPC .......... G06F 1/189; G06F 1/183; G06F 1/181; G06F 1/18; G01R 31/52; H01B 9/02;

H01B 9/04; H01B 9/021; H01B 9/022; H01B 9/023; H01B 9/024; H01B 9/025; H01B 9/026; H01B 9/027; H01B 9/028; H01B 9/029
See application file for complete search history.

(56) References Cited

U.S. PATENT DOCUMENTS

| | | | | |
|---|---|---|---|---|
| 4,228,475 A | * | 10/1980 | Sherwood | G01R 31/52 |
| | | | | 324/510 |
| 4,371,832 A | * | 2/1983 | Wilson | H02H 3/332 |
| | | | | 324/509 |
| 5,477,152 A | | 12/1995 | Hayhurst | |
| 6,100,702 A | * | 8/2000 | Hagen | G01R 19/16542 |
| | | | | 324/509 |
| 6,148,352 A | * | 11/2000 | Coale | G11B 33/126 |
| 6,344,748 B1 | | 2/2002 | Gannon | |
| 12,057,807 B2 | * | 8/2024 | Yoscovich | H10F 19/00 |
| 2007/0072443 A1 | * | 3/2007 | Rohrbach | G06F 1/1633 |
| | | | | 439/39 |
| 2012/0285723 A1 | * | 11/2012 | Gundel | H01B 7/0823 |
| | | | | 174/113 R |
| 2014/0285930 A1 | * | 9/2014 | Powell | G01R 31/52 |
| | | | | 361/139 |
| 2015/0226779 A1 | * | 8/2015 | Carletti | G01R 23/02 |
| | | | | 324/509 |
| 2018/0270944 A1 | * | 9/2018 | Hatakenaka | H05K 1/18 |

(Continued)

*Primary Examiner* — Anthony M Haughton
(74) *Attorney, Agent, or Firm* — Larson Newman, LLP

(57) ABSTRACT

An information handling system includes first and second printed circuit boards (PCBs) and a cable coupled at a first end to the first PCB and at a second end to the second PCB. The cable includes a power conductor, a ground conductor, and a signal ground conductor. The second PCB includes a power rail coupled to the power conductor, a system ground coupled to the ground conductor, and a short circuit detector coupled between the signal ground conductor and the system ground.

18 Claims, 3 Drawing Sheets

(56)     References Cited

U.S. PATENT DOCUMENTS

| | | | | |
|---|---|---|---|---|
| 2020/0191856 | A1* | 6/2020 | Peralta | G01R 31/14 |
| 2021/0098985 | A1* | 4/2021 | Kim | H02H 7/26 |
| 2021/0303048 | A1* | 9/2021 | Jyani | G06F 1/266 |
| 2021/0341538 | A1* | 11/2021 | Choi | H02H 3/08 |
| 2022/0271513 | A1* | 8/2022 | Arduini | H01R 13/639 |
| 2022/0326746 | A1* | 10/2022 | Mason | G06F 1/181 |
| 2024/0414869 | A1* | 12/2024 | Schnell | H05K 7/1427 |
| 2025/0038494 | A1* | 1/2025 | Jones | H02B 1/26 |

* cited by examiner

200

DISPLAY PANEL CABLE FAULT DETECTION

FIELD OF THE DISCLOSURE

This disclosure generally relates to information handling systems, and more particularly relates to detecting display panel cable faults in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include first and second printed circuit boards (PCBs) and a cable coupled at a first end to the first PCB and at a second end to the second PCB. The cable may include a power conductor, a ground conductor, and a signal ground conductor. The second PCB may include a power rail coupled to the power conductor, a system ground coupled to the ground conductor, and a short circuit detector coupled between the signal ground conductor and the system ground.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1A:
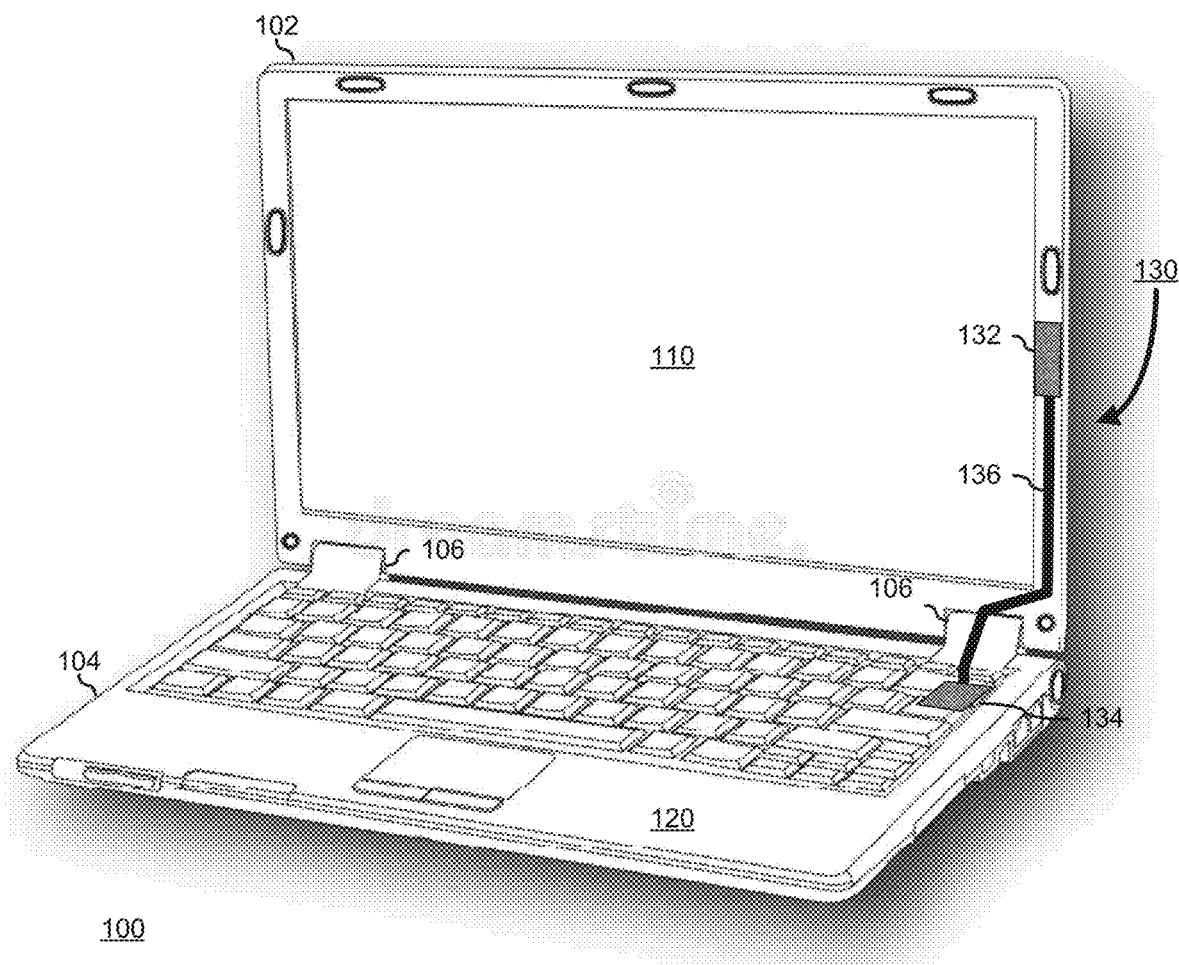
FIG. 1A is a perspective view of an information handling system according to an embodiment of the current disclosure.

FIG. 1A shows an information handling system 100, illustrated here as a laptop computer system. Information handling system 100 includes cover enclosure 102 and a base enclosure 104. Cover enclosure 102 and base enclosure 104 are joined by hinges 106 that permit the cover enclosure to be moved relative to the base enclosure in one of a closed position and a variable open position. Cover enclosure 102 houses a display panel 110 and other elements of information handling system 100, such as various microphones, cameras, WiFi antennas, or other elements, as needed or desired. Thus as used herein, display panel 110 may broadly represent any devices included within cover housing 102. Base enclosure 104 houses a motherboard 120 and other elements of information handling system 100, such as various speakers, touchpad devices, a keyboard, storage devices, or other elements, as needed or desired. Thus as used herein, motherboard 120 may broadly represent any devices included within base housing 104.

Figure 1B:
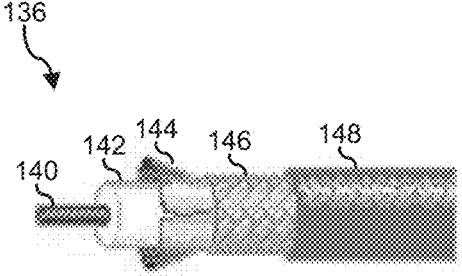
FIG. 1B is a diagram of a coaxial cable of the information handling system of FIG. 1A.

Display panel 110 and motherboard 120 are electrically connected together by one or more cable assembly 130. Cable assembly 130 includes a connector 132 to electrically connect to display panel 110 and a connector 134 to electrically connect to motherboard 120. Connectors 132 and 134 are interconnected by a transmission cable 136. Transmission cable 136 is illustrated more fully in FIG. 1B, and represents a coaxial cable and includes a conductor 140 surrounded by an inner insulator 142. Insulator 142 is in turn surrounded by at least one of a conductive foil 144 and a conductive sheath 146 that together form a conductive shield for conductor 140. The conductive shield is surrounded by one or more outer insulator 148. Transmission cable 136 as illustrated is exemplary of various types of coaxial cable configurations, and the actual configuration of a transmission cable, as used herein, may vary from the illustrated coaxial cable, without varying the scope of the current embodiments. Cable assembly 130 may include one or more transmission cable similar to transmission cable 136, as needed or desired, and multiple transmission cables may be fabricated as a ribbon cable or cable bundle, as needed or desired. Additionally, cable assembly 130 may include one or more individual conductors, as needed or desired.

The signals conducted on conductor 140 are typically high-speed signals that are susceptible to interference from exterior signals or that are subject to interfere with other elements included within cover housing 102, such as WiFi antennas, or the like, and are thus provided with electromagnetic shielding by connecting the conductive shield (conductive foil 144 and conductive sheath 146) to a system ground of information handling system 100. Cable assembly 130 is routed between display panel 110 and motherboard 120 through hinge 106.

As such, the conductors within cable assembly 130, and particularly transmission cable 136, are subjected to considerable bending stress. Combined with the fact that transmission cable 136 is typically a very small conductor, this bending stress may result in a breakdown of inner insulator 142, resulting in a shorting of conductor 140 to the conductive shield. In some cases, such as where conductor 140 represents a data signal conductor, such shorting may result in signal degradation and subsequent failure of the associated data interface, such as loss of picture on display panel 110. In more extreme cases, such as where conductor 140 represents a conductor that supplies a voltage rail to display panel 110, such shorting may represent a dead short to ground which may result in power MOSFET damage on motherboard 120, a blown fuse on the motherboard, or overheating and damage to one or more of cover housing 102, base housing 104, and hinge 106, with the associated fire danger.

More generally, the inventors of the current disclosure have noted that field service activities involving "no video" problems may be caused by a number of different failure modes, including cable shorts. However in the absence of a dedicated method to detect cable shorts, field service personnel are typically faced with problem resolution procedures that include the replacement of the display panel, the motherboard, and the cable assembly, even when there may be no real issue with the display panel or the motherboard. As such it has been understood that the early detection of shorting within a cable assembly is desirable to mitigate damage to other elements of the information handling system (that is, the motherboard, etc.), to reduce the cost of field service activities, and for consumer safety.

Figure 2:
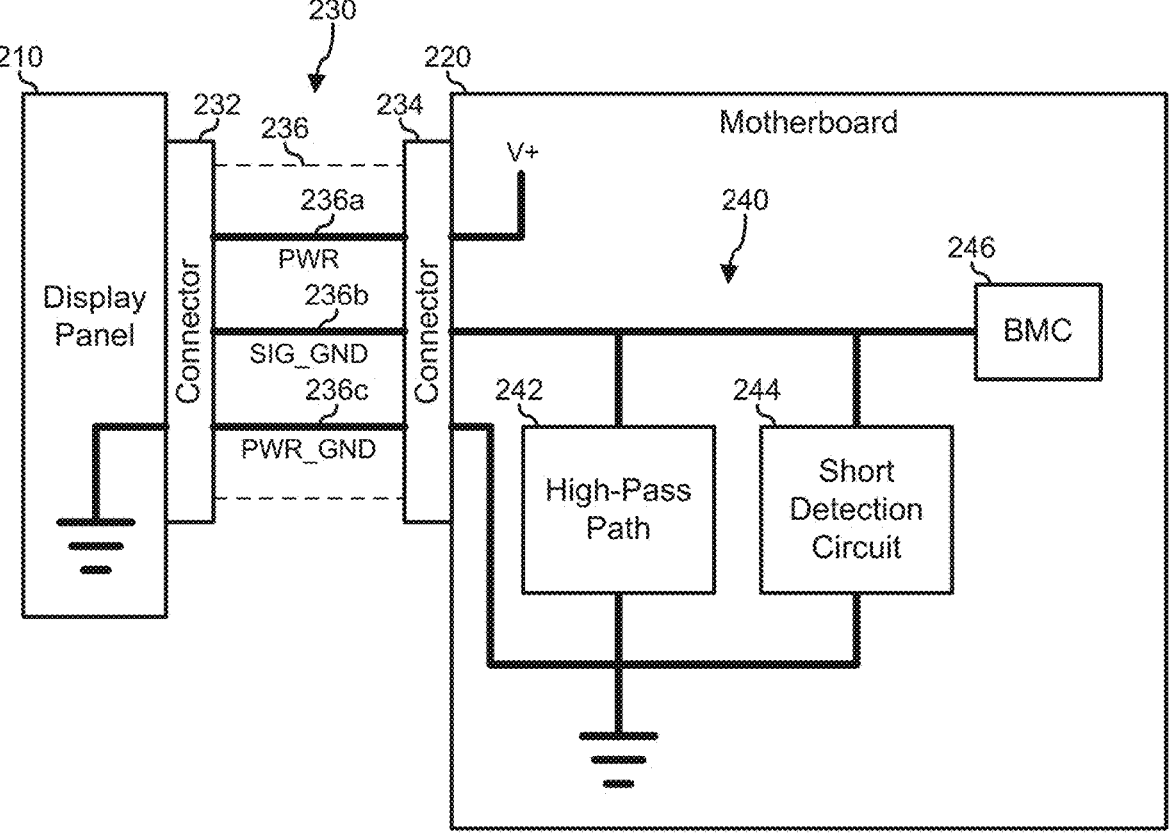
FIG. 2 is a block diagram of an information handling system according to another embodiment of the current disclosure.

FIG. 2 illustrates an information handling system 200 similar to information handling system 100, and including a display panel 210, a motherboard 220, and a cable assembly 230. Display panel 210 represents the components of information handling system 200 that may be included in a cover housing of a laptop computer, and motherboard 220 represents the components that may be included in a base housing of the information handling system. As such, cable assembly 230 is provided to connect the components of display panel 210 to the components of motherboard 220. Cable assembly 230 includes a display panel connector 232, a motherboard connector 234, and conductors 236, including a power conductor (PWR) 236a, a signal ground conductor (SIG_GND) 236b, and a power ground conductor (PWR_GND) 236c.

Power conductor (PWR) 236a is connected to a power rail (V+) of motherboard 220 to provide power to display panel 210. Signal ground conductor (SIG_GND) 236b represents one or more conductive shields of coaxial cables of cable assembly 230. Note that the one or more signal conductor associated with signal ground conductor (SIG_GND) 236b are not illustrated for simplicity of illustration of the current embodiments. Signal ground conductor (SIG_GND) 236b represents one or more conductive shield of a coaxial transmission cable, such as illustrated by conductive foil 144 and conductive sheath 146, as described above. Signal ground conductor (SIG_GND) 236b is connected to a ground fault detection circuit 240 on motherboard 220, as described further below. Power ground conductor (PWR_GND) 236c represents one or more power ground conductors of cable assembly 230 that conduct power return current from display panel 210 to a system ground of motherboard 220. Power delivery and return in an information handling system is known in the art and will not be further described herein, except as may be needed to illustrate the current embodiments.

It has been understood by the inventors of the current disclosure that the typical configuration for coaxial transmission cables within a cable assembly is to connect the conductive shield at the motherboard to the system ground to dampen high-frequency noise that would otherwise be induced into the associated signal conductor or that would otherwise be radiated by the signal conductor. As such, the conductive shield would not typically be expected to carry a discernable direct current (DC) return current from the display panel to the motherboard, such DC return current being handled by the power ground conductor (PWR_GND) of the cable assembly.

Ground fault detection circuit 240 operates to isolate signal ground conductor (SIG_GND) 236b from the system ground. In particular, ground fault detection circuit 240 includes a high-pass circuit path 242, a short circuit detection circuit 244, and a baseboard management controller (BMC) 246. High-pass circuit path 242 and short circuit detection circuit 244 are connected in parallel between signal ground conductor (SIG_GND) 236b and the system ground. High-pass circuit path 242 operates to permit the high-frequency noise on signal ground conductor (SIG_GND) 236b to pass to the system ground, thereby dampening the noise that would otherwise be coupled onto the associated signal conductor or that would otherwise be radiated by the signal conductor, as may be provided by the typical configuration, as described above. An example of high-pass circuit path 242 may include a bank of one or more capacitors connected in parallel between signal ground conductor (SIG_GND) 236b and the system ground, a passive resistor-inductor (RL) network, an active inverting or non-inverting op amp circuit, as needed or desired.

Short circuit detection circuit 244 represents a DC current detection circuit, such as a resistor connected between signal ground conductor (SIG_GND) 236b and the system ground. Here, it will be understood that, because signal ground conductor (SIG_GND) 236b does not normally carry DC return current from display panel 210 to motherboard 220, a DC voltage at the signal ground conductor (SIG_GND) will be substantially equal to the system ground voltage (0V). This "zero current" signal, that is, the 0V on short circuit detection circuit 244, is provided to BMC 246 to indicate that cable assembly 230 has no short circuits. On the other hand, when signal ground conductor (SIG_GND) 236b exhibits the same high voltage level as that of the power conductor (PWR) 236a, and the high voltage level is detected by short circuit detection circuit 244 at the input of BMC 246, providing an indication that cable assembly 230 is experiencing a short circuit.

Figure 3:
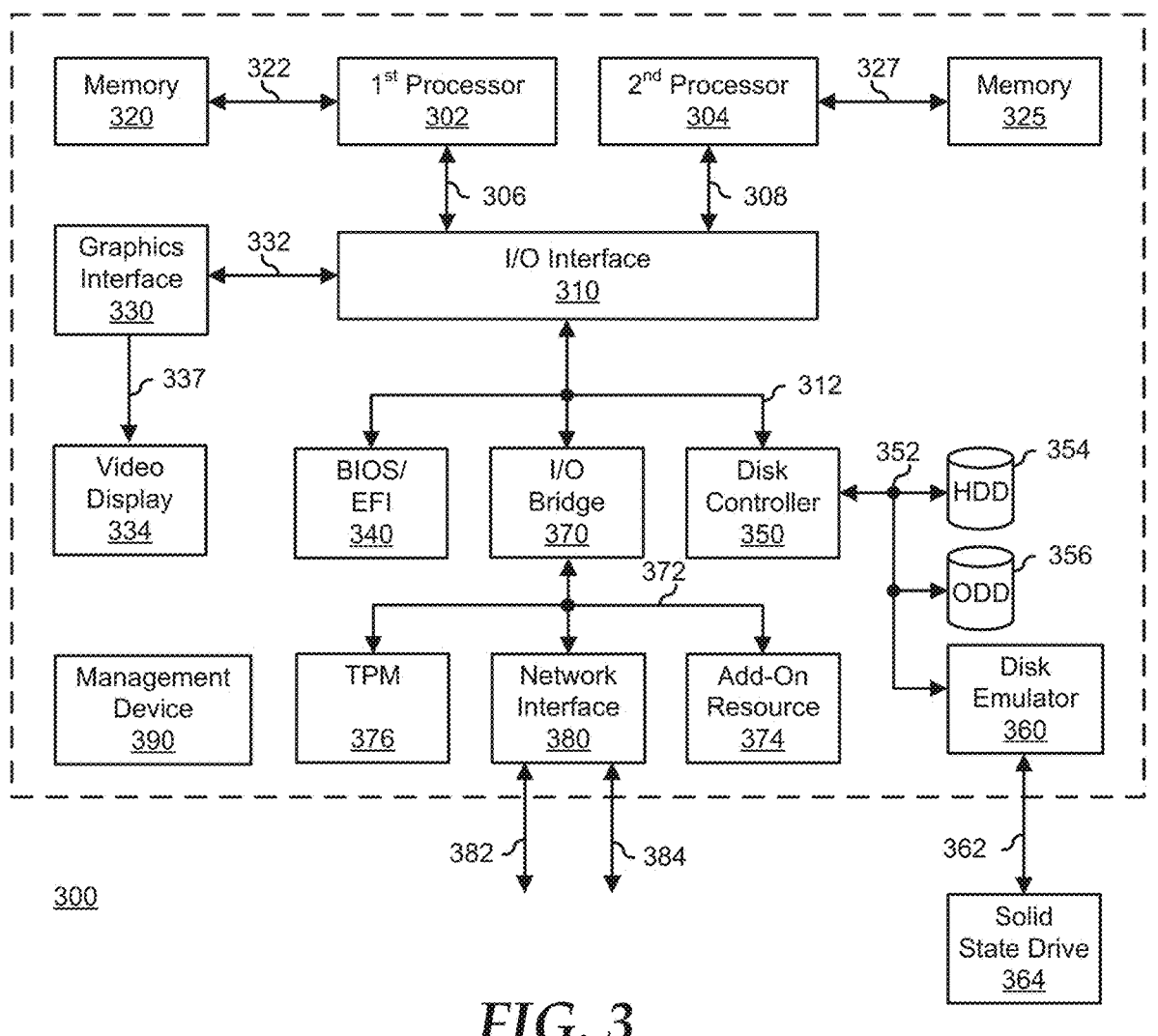
FIG. 3 is a block diagram illustrating a generalized information handling system according to another embodiment of the present disclosure.

FIG. 3 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 364, an I/O bridge 370, one or more add-on resources 374, a trusted platform module (TPM) 376, a network interface 380, a management device 390, and a power supply 395. Processors 302 and 304, I/O interface 310, memory 320, graphics interface 330, BIOS/UEFI module 340, disk controller 350, HDD 354, ODD 356, disk emulator 360, SSD 364, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 336 to a video display 334. In a particular embodiment, information handling system 300 includes separate memories that are dedicated to each of processors 302 and 304 via separate memory interfaces. An example of memories 320 and 325 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 2394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a first printed circuit board (PCB);
a cable coupled at a first end to the first PCB, the cable including a power conductor, a ground conductor, and a signal ground conductor;
a second PCB coupled to a second end of the cable, the second PCB including a power rail coupled to the power conductor, a system ground coupled to the ground conductor, and a short circuit detector coupled between the signal ground conductor and the system ground; and a baseboard management controller configured to receive an indication from the short circuit detector when the short circuit detector detects a direct current on the signal ground conductor.

2. The information handling system of claim 1, wherein the cable includes a coaxial cable having a signal conductor and a shield conductor.

3. The information handling system of claim 2, wherein the shield conductor includes the signal ground conductor.

4. The information handling system of claim 3, wherein the short circuit detector includes a high-pass filter coupled between the signal ground conductor and the system ground.

5. The information handling system of claim 4, wherein the high-pass filter is configured to pass high-frequency ripple currents induced on the signal ground conductor to the system ground.

6. The information handling system of claim 5, wherein the high-pass filter includes a capacitor coupled between the signal ground conductor and the system ground.

7. The information handling system of claim 4, wherein the short circuit detector further includes a short detection circuit configured to detect a direct current on the signal ground conductor.

8. The information handling system of claim 7, wherein the short detection circuit includes a resistor coupled between the signal ground conductor and the system ground.

9. The information handling system of claim 1, wherein the first PCB includes a display panel of a laptop computer and the second PCB includes a motherboard of the laptop computer, and wherein the cable is routed through a hinge between the display panel and the motherboard.

10. A method, comprising:
providing, in an information handling system, a first printed circuit board (PCB);
providing a cable coupled at a first end to the first PCB, the cable including a power conductor, a ground conductor, and a signal ground conductor; and
providing a second PCB coupled to a second end of the cable, the second PCB including a power rail coupled to the power conductor, a system ground coupled to the ground conductor, and a short circuit detector coupled between the signal ground conductor and the system ground;
providing, in the information handling system, a baseboard management controller; and
receiving, by the baseboard management controller, an indication from the short circuit detector when the short circuit detector detects a direct current on the signal ground conductor.

11. The method of claim 10, wherein the cable includes a coaxial cable having a signal conductor and a shield conductor.

12. The method of claim 11, wherein the shield conductor includes the signal ground conductor.

13. The method of claim 12, wherein the short circuit detector includes a high-pass filter coupled between the signal ground conductor and the system ground.

14. The method of claim 13, wherein the high-pass filter is configured to pass high-frequency ripple currents induced on the signal ground conductor to the system ground.

15. The method of claim 14, wherein the high-pass filter includes a capacitor coupled between the signal ground conductor and the system ground.

16. The method of claim 13, wherein the short circuit detector further includes a short detection circuit configured to detect a direct current on the signal ground conductor.

17. The method of claim 16, wherein the short detection circuit includes a resistor coupled between the signal ground conductor and the system ground.

18. An information handling system, comprising:

a first printed circuit board (PCB);

a cable coupled at a first end to the first PCB, the cable including a power conductor, a ground conductor, and a signal ground conductor; and a second PCB coupled to a second end of the cable, the second PCB including a power rail coupled to the power conductor, a system ground coupled to the ground conductor, and a short circuit detector coupled between the signal ground conductor and the system ground, wherein the short circuit detector is configured to detect a short circuit between the power conductor and the signal ground conductor;

a baseboard management controller configured to receive an indication from the short circuit detector when the short circuit detector detects the short circuit;

wherein the cable includes a coaxial cable having a signal conductor and a shield conductor, and the shield conductor includes the signal ground conductor.

* * * * *